U S008697465B2

(12) United States Patent
Tu et al.

(10) Patent No.: US 8,697,465 B2
(45) Date of Patent: Apr. 15, 2014

(54) LED EPITAXIAL STRUCTURE AND MANUFACTURING METHOD

(75) Inventors: Po-Min Tu, Hsinchu (TW); Shih-Cheng Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/300,617

(22) Filed: Nov. 20, 2011

(65) Prior Publication Data

US 2012/0211771 A1  Aug. 23, 2012

(30) Foreign Application Priority Data

Feb. 18, 2011  (CN) .......................... 2011 1 0041286

(51) Int. Cl.
*H01L 21/00*  (2006.01)
(52) U.S. Cl.
USPC ........... 438/37; 438/29; 438/45; 257/E33.007
(58) Field of Classification Search
USPC ........... 257/79, 101, E33.007; 438/29, 37, 45
See application file for complete search history.

(56) References Cited

U.S. PATENT DOCUMENTS

| 4,208,257 A * | 6/1980 | Hom-ma et al. ................. 216/13 |
| 7,804,100 B2 | 9/2010 | Wierer, Jr. et al. |
| 2002/0070125 A1* | 6/2002 | Ng et al. ........................ 205/640 |
| 2002/0110945 A1* | 8/2002 | Kuramata et al. ............... 438/36 |
| 2010/0133504 A1 | 6/2010 | Wang et al. |

FOREIGN PATENT DOCUMENTS

| CN | 1797712 A | 7/2006 |
| CN | 101859835 A | 10/2010 |
| TW | 200307374 | 12/2003 |
| TW | 201023388 A1 | 6/2010 |

* cited by examiner

*Primary Examiner* — Colleen Matthews
*Assistant Examiner* — Colleen E Snow
(74) *Attorney, Agent, or Firm* — Novak Druce Connolly Bove + Quigg LLP

(57) ABSTRACT

An LED epitaxial structure includes a substrate, a buffer layer and an epitaxial layer. The buffer layer is grown on a top surface of the substrate, and the epitaxial layer is formed on a surface of the buffer layer. The epitaxial layer has a first n-type epitaxial layer and a second n-type epitaxial layer. The first n-type epitaxial layer is formed between the buffer layer and the second n-type epitaxial layer. The first n-type epitaxial layer has a plurality of irregular holes therein.

5 Claims, 5 Drawing Sheets

LED EPITAXIAL STRUCTURE AND MANUFACTURING METHOD

BACKGROUND

1. Technical Field

The disclosure relates to light emitting diodes, and particularly to an LED epitaxial structure and a method for manufacturing the LED epitaxial structure.

2. Description of the Related Art

Light emitting diodes' (LEDs) many advantages, such as high luminosity, low operational voltage, low power consumption, compatibility with integrated circuits, easy driving, long term reliability, and environmental friendliness have promoted their wide use as a light source. Now, light emitting diodes are commonly applied in environmental lighting. However, a common LED structure is epitaxial grown on a sapphire. A large difference of lattice constant and thermal expansion coefficient is between an epitaxial layer and the sapphire. That produces high density dislocation. Furthermore, high density dislocation reduces the light emitting efficiency. Therefore, the epitaxial layer will absorb part of the light from an active layer. A part of light from the active layer is confined due to high refraction efficiency and is absorbed by the substrate. Therefore, increasing light extraction efficiency is an important issue.

Therefore, it is desirable to provide an LED epitaxial structure and a method for manufacturing the LED epitaxial structure, which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present LED epitaxial structure and a method for manufacturing the LED epitaxial structure. Moreover, in the drawings, like reference numerals designate corresponding parts throughout the views.

DETAILED DESCRIPTION

Embodiments of LED epitaxial structure and a method for manufacturing the LED epitaxial structure as disclosed are described in detail here with reference to the drawings.

Figure 1:
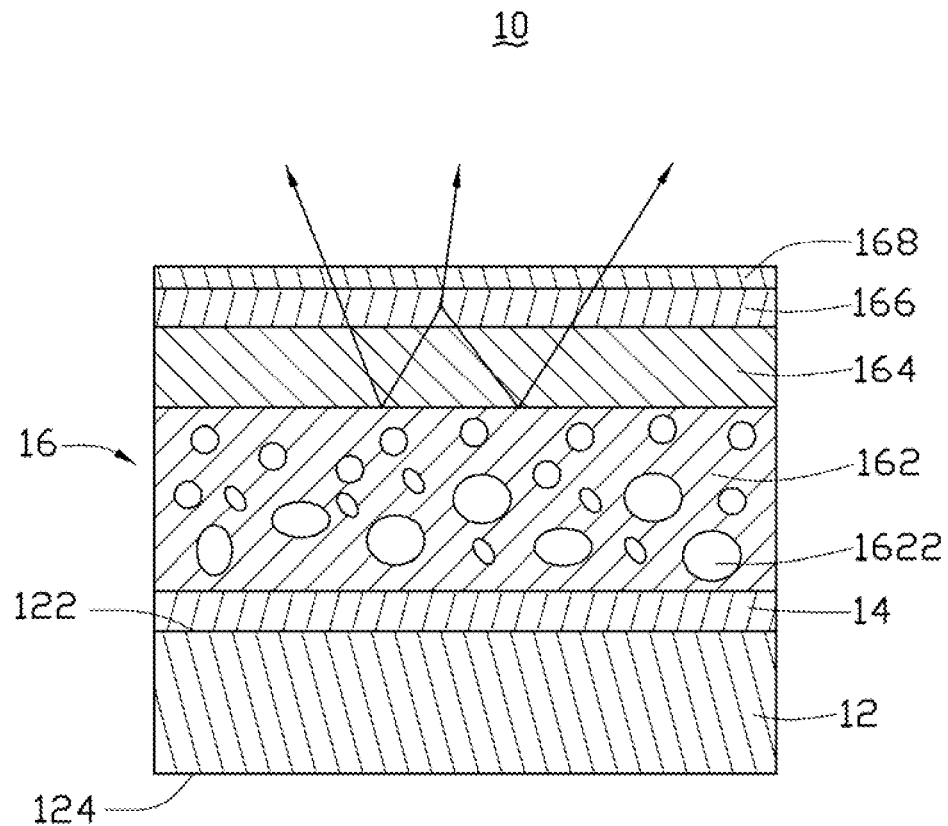
FIG. 1 is a cross sectional view of an LED epitaxial structure in accordance with a first embodiment.

Referring to FIG. 1, an LED epitaxial structure 10 includes a substrate 12, a buffer layer 14, and an epitaxial layer 16. The substrate 12 includes a top surface 122 and a bottom surface 124. The buffer layer 14 is grown on the top surface 122 of the substrate 12. The epitaxial layer 16 is grown on a top surface of the buffer layer 14. The substrate 12 is a sapphire. The epitaxial layer 16 includes a first n-type epitaxial layer 162, a second n-type epitaxial layer 164, an active layer 166, and a p-type epitaxial layer 168.

The first n-type epitaxial layer 162 is formed between the buffer layer 14 and the second n-type epitaxial layer 164, and the first n-type epitaxial layer 162 has a plurality of irregular holes 1622. The irregular holes 1622 have different sizes, different shapes, and different distribution locations. A size of the irregular holes 1622 near the buffer layer 14 exceeds the size of the irregular holes 1622 near the second n-type epitaxial layer 164. Wet etching forms the irregular holes 1622. Air is in the inside of the irregular holes 1622.

The second n-type epitaxial layer 164 is formed on a top surface of the first n-type epitaxial layer 162 and seals openings of the irregular holes 1622 exposed from the top surface of the n-type epitaxial layer 162. Thus, air is sealed inside the irregular holes 1622. Due to the difference between the refraction indexes of the first n-type epitaxial layer 162 and air of the irregular holes 1622, the first n-type epitaxial layer 162 reflects the light from the active layer 166. In this embodiment, the active layer 166 is grown on the second n-type epitaxial layer 164. Then, the p-type epitaxial layer 168 is grown on the active layer 166. The first n-type epitaxial layer 162 reflects light from the active layer 166, thus, enhancing the luminous efficiency of the LED epitaxial structure 10.

Figure 2:
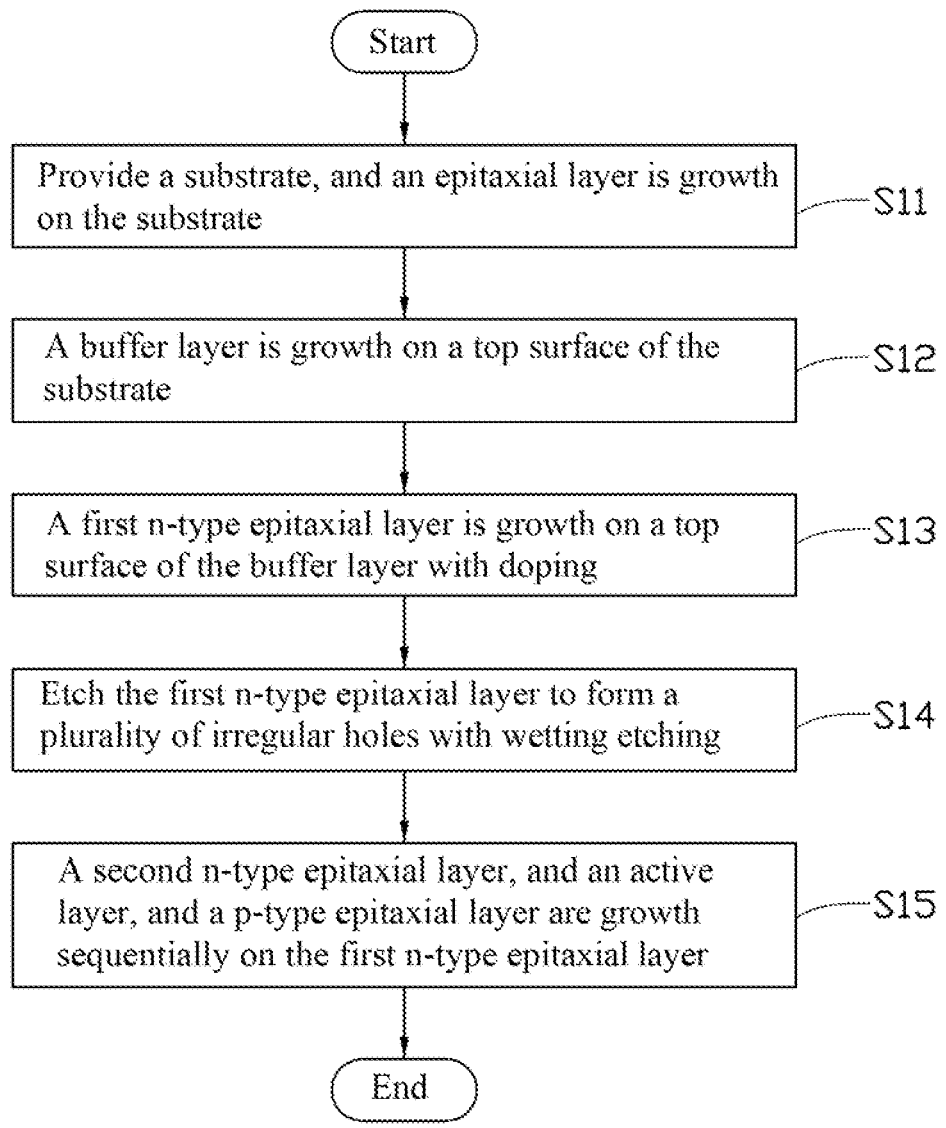
FIG. 2 is a processing flow of manufacturing the LED epitaxial structure of FIG. 1.

Referring to FIG. 2 and S11, provide the substrate 12, and the epitaxial layer 16 is grown on the substrate 12.

Referring to FIG. 2 and S12, the buffer layer 14 is grown on the top surface of the substrate 12.

Referring to FIG. 2 and S13, the first n-type epitaxial layer 162 is doped and is grown on the top surface of the buffer layer 14.

Referring to FIG. 2 and S14, wet etching etches the first n-type epitaxial layer 162 to form a plurality of irregular holes 1622.

Referring to FIG. 2 and S15, the second n-type epitaxial layer 164, the active layer 166, and the p-type epitaxial layer 168 are grown sequentially on the first n-type epitaxial layer 162.

Referring to S11 of FIG. 2, providing the substrate 12, the substrate 12 is a sapphire structure. The buffer layer 14 is first grown on the top surface 122 of the substrate 12. Then, the epitaxial layer 16 is grown on the buffer layer 14. Thus, the buffer layer 14 is formed between the substrate 12 and the epitaxial layer 16.

The buffer layer 14 can adjust the defect density of the epitaxial layer 16. The epitaxial layer 16 includes the first n-type epitaxial layer 162, the second n-type epitaxial layer 164, the active layer 16, and the p-type epitaxial layer 168.

Figure 3:
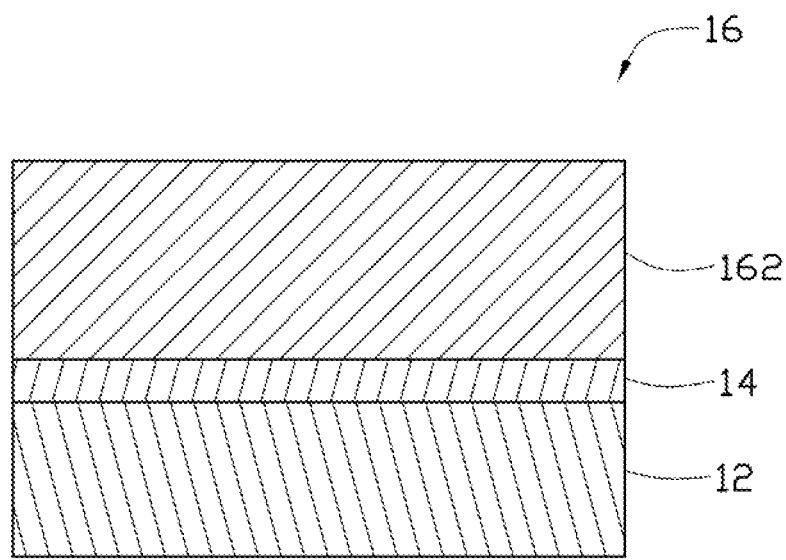
FIG. 3 is a cross sectional view of growing a first n-type epitaxial layer on a buffer layer of a substrate of FIG. 1.

Referring to FIG. 3, when the buffer layer 14 is grown, the first n-type epitaxial layer 162 is doped and grown on the top surface of the buffer layer 14 (as shown FIG. 3). The highly doped concentration gradually decreases to the low doped concentration from a bottom surface to a top surface of the first n-type epitaxial layer 162. For example, $10^{19}$ doped concentration gradually decreases to $10^{18}$.

Figure 4:
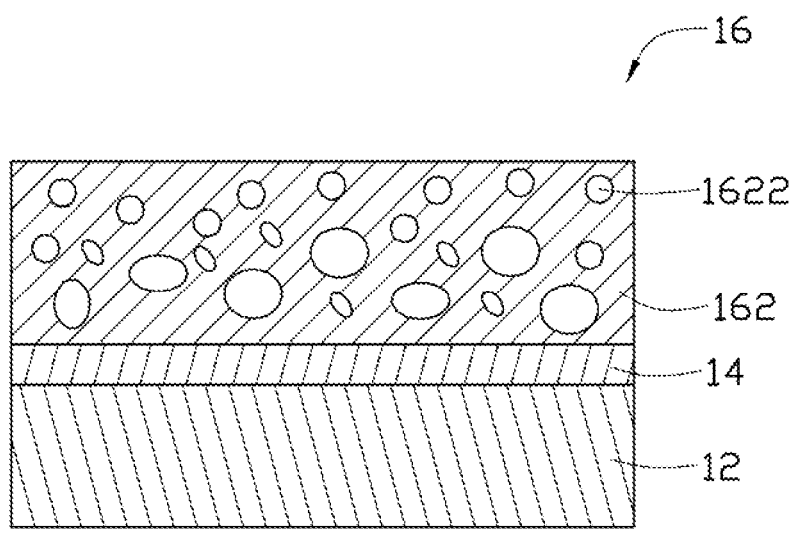
FIG. 4 is a cross sectional view of wet etching the first n-type epitaxial layer of FIG. 3.

Referring to FIG. 4, etch the first n-type epitaxial layer 162 with wet etching to form the plurality of irregular holes 1622. In this embodiment, wet etching is a bias-assisted wet etching. The first n-type epitaxial layer 162 deposited on the buffer layer 14 of the substrate 12 is immerged into oxalic acid solution, and the oxalic acid solution is applied bias. Thus, an electric field is produced. The etching rate of the oxalic acid solution to the first n-type epitaxial layer 162 becomes faster due to the applied bias. During the wet etching process with the oxalic acid solution, a portion of the highly doped concentration induces the larger electric field and attracts more ions due to the applied bias. Thus, the etching rate, density of the irregular holes 1622, and distribution of sizes of the irregular holes 1622 at highly doped concentration are different from those at the low doped concentration. The size of the irregular holes 1622 near the buffer layer 14 inside the first n-type epitaxial layer 162 exceeds the size of irregular holes 1622 near the second n-type epitaxial layer 164 inside the first n-type epitaxial layer 162.

Figure 5:
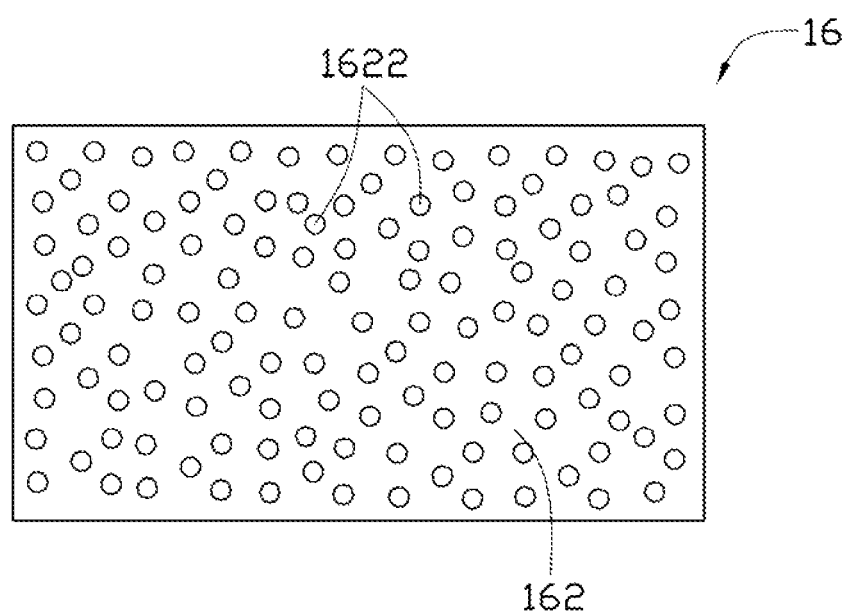
FIG. 5 is a top view of wet etching the first n-type epitaxial layer of FIG. 3.

The smaller irregular holes 1622 are located at the upper portion of the first n-type epitaxial layer 162. Referring to FIG. 5, the smaller holes 1622 are densely positioned in the top surface of the first n-type epitaxial layer 162. That enhances the growth of the second n-type epitaxial layer 164 and the reflectivity of the first n-type epitaxial layer 162.

Finally, the second n-type epitaxial layer 164, the active layer 166, and the p-type epitaxial layer 168 are grown sequentially on the first n-type epitaxial layer 162. The second n-type epitaxial layer 164 is grown on the first n-type epitaxial layer 162. Thus, openings of the irregular holes 1622 of the first n-type epitaxial layer 162 are sealed. Therefore, a plurality of air holes is formed in the irregular holes 1622 of the first n-type epitaxial layer 162. Due to the difference between the refraction indexes of the first n-type epitaxial layer 162 and air of the irregular holes 1622, the first n-type epitaxial layer 162 outwardly reflects light from the active layer 166. Thus, light extraction efficiency of the LED epitaxial structure 10 is enhanced.

While the disclosure has been described by way of example and in terms of exemplary embodiment, it is to be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing an LED epitaxial structure, includes steps:
   providing a substrate;
   providing a buffer layer grown on a top surface of the substrate;
   a first n-type epitaxial layer being doped and grown on a top surface of the buffer layer, the first n-type epitaxial layer being doped and grown with a high doping concentration gradually decreasing to a low doping concentration from a bottom surface to a top surface of the first n-type epitaxial layer;
   immerging the first n-type epitaxial layer to form a plurality of irregular holes with wet etching;
   and a second n-type epitaxial layer, and an active layer, and a p-type epitaxial layer being grown sequentially on the first n-type epitaxial layer.

2. The method for manufacturing the LED epitaxial structure of claim 1, wherein the highly doped concentration gradually decreases to the low doped concentration, and the highly doped concentration is near the buffer layer.

3. The method for manufacturing the LED epitaxial structure of claim 1, wherein the first n-type epitaxial layer deposited on the buffer layer of substrate is immerged into an oxalic acid solution.

4. The method for manufacturing the LED epitaxial structure of claim 3, wherein the wet etching is a bias-assisted wet etching, the oxalic acid solution is applied bias, and an electric field is produced.

5. The method for manufacturing the LED epitaxial structure of claim 1, wherein the highly doped concentration is $10^{19}$ and the low doped concentration is $10^{18}$.

* * * * *